(12) United States Patent
Appel et al.

(10) Patent No.: US 6,219,733 B1
(45) Date of Patent: *Apr. 17, 2001

(54) TRANSMISSION LINE LOOP

(75) Inventors: William Dale Appel, Cedar Park; Gricell Co; Franklin Mark Liu, both of Austin, all of TX (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/140,372

(22) Filed: Aug. 26, 1998

(51) Int. Cl.[7] .................................................... G06F 13/00
(52) U.S. Cl. ......................... 710/102; 710/129; 709/232
(58) Field of Search .................................. 710/102, 104, 710/118, 129; 709/200, 201, 232, 239

(56) References Cited

U.S. PATENT DOCUMENTS

| 3,751,591 | * | 8/1973 | Radcliffe et al. ...................... 178/68 |
| 4,467,436 |   | 8/1984 | Chance et al. ........................ 364/513 |
| 5,146,587 | * | 9/1992 | Francisco ............................. 395/575 |
| 5,182,798 | * | 1/1993 | Francisco ............................. 395/200 |
| 5,185,866 | * | 2/1993 | Francisco ............................. 395/325 |
| 5,438,297 |   | 8/1995 | Rahal-Arabi et al. ............... 327/565 |
| 5,450,603 |   | 9/1995 | Davies ................................. 395/800 |

* cited by examiner

*Primary Examiner*—Robert Beausoleil
*Assistant Examiner*—Tim Vo
(74) *Attorney, Agent, or Firm*—Kelly K. Kordzik; Winstead Sechrest & Minick P.C.; Leslie A. Van Leeuwen

(57) ABSTRACT

Two daughter cards connected by bus connectors to a motherboard have integrated circuits connected to each other and to an integrated circuit on the motherboard through a bus network. The bus network is also connected by a bus cable connected at the top of the two daughter cards so as to form a loop within the bus network.

19 Claims, 5 Drawing Sheets

TRANSMISSION LINE LOOP

TECHNICAL FIELD

The present invention relates i n general to data processing systems, and in particular, to transmission lines within integrated circuit technologies.

BACKGROUND INFORMATION

The construction of a computer system has evolved to a modular architecture, where various subsystems are implemented on daughterboards, which are connected to the motherboard. The motherboard is the main circuit board containing the primary components of the computer system. This board often contains the processor, main memory, support circuitry, and a bus controller and connector. Daughterboards, including expansion memory, input/output, and multiprocessor boards, may attach to the motherboard via a plurality of bus connectors.

Considerable effort has been made to speed up the various integrated circuits, which make up a computer system. However, as integrated circuit technologies shrink and their performance increases, the printed circuit board becomes the gating and most significant single factor limiting the speeds by which signals are transmitted on the bus lines connecting the various integrated circuits. The cycle budget for a synchronous bus can be broken into three contributing factors. One, is driving and receiving integrated circuit delays with respect to the system clock. Another is the system clock skew. The third contributor is the card net delay, which is the time required to propagate signals over the transmission lines within the network of bus lines connecting the various integrated circuits. However, improvements in the card net delay have been few.

The net delay is principally dictated by the printed circuit board ("PCB") technology, the topology of the net, and the rise and fall times of the driver circuitry. The fastest possible net is a point-to-point net. The delay of such a point-to-point net is the propagation speed of the board times the net link, plus the delay lost to a slowing of the rise and fall times due to the capacitive load introduced by the receiver. Additionally, a point-to-point solution results in the need for added buffering and additional control logic, which results in a more expensive solution. Furthermore, additional cycles are needed to implement such point-to-point nets.

Multidrop nets are more common in higher volume, lower cost systems, and are prevalent on data buses. Such nets have loads that are bidirectional. The main challenge on multidrop nets is to lay them out and route them such that the signal reflections do not significantly distort waveforms in the critical threshold regions of the receiving devices. A second challenge is arriving at a topology that optimizes all the scenarios such that delays due to reflections are minimized.

Once the integrated circuit technologies, clock distribution and mechanical requirements have been established, the card designer is left with limited possibilities in routing the net so as to not only assure that they run reliably but also optimized for speed. The normal cost of reliability of the net is additional delay.

SUMMARY OF THE INVENTION

The present invention addresses the foregoing problems by optimizing a reflection profile of a data net. A reflection profile is the addition of reflections added to the originally received waveform that produces the observed waveform shape at the receiver. The optimization of the waveform profile is the reduction or movement of reflections in order to clean up threshold regions and speed up the worst case net delay scenario. Such a scenario is the waveform profile at each receiver when one of the drivers owns the bus.

In an embodiment of the present invention, a bus cable is connected between two daughter cards (daughterboards) mounted on a system board (motherboard) so as to provide a complete loop when the integrated circuits on the daughter cards are also connected to an integrated circuit on the motherboard. An advantage of the present invention is that no modifications need to be made to the motherboard. Instead, the daughter cards are replaced with upgraded daughter cards having the connections from the integrated circuits to the connectors, which are then connected with the bus cable. This can be accomplished with a cable connected at the top of the daughter cards, thus eliminating any need to modify or replace the motherboard, which can be considerably more troublesome and expensive.

One advantage with this implementation is that the motherboard need not be replaced when the user upgrades to a system whereby multiple daughter cards are now needed. Instead, merely the daughter cards are replaced with the daughter cards modified in accordance with the present invention, which are then connected using the bus cable.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
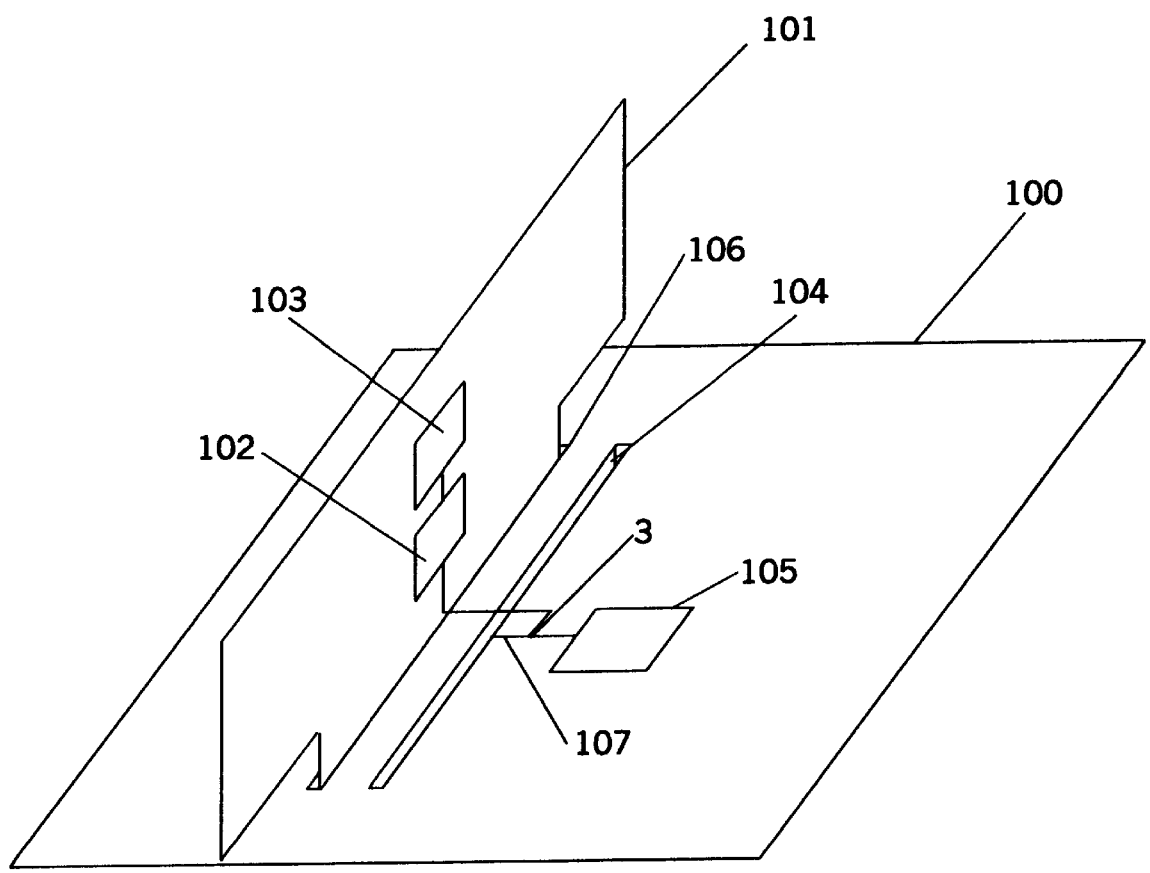
FIG. 1 illustrates a prior art configuration.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 illustrates a prior art configuration wherein system board (motherboard) 100 within a computer system (not shown) has first and second CPU connectors 106 and 104, respectively, connected by data net 107 to memory controller 105. Mounted within connector 106 is CPU card 101 having CPU1 102 and CPU2 103 connected to each other and to data net 107 through connector 106. Not shown is a second CPU card, which would be mounted within second CPU connector 104, and having a plurality of CPU chips mounted thereon and connected to data net 107.

Figure 2:
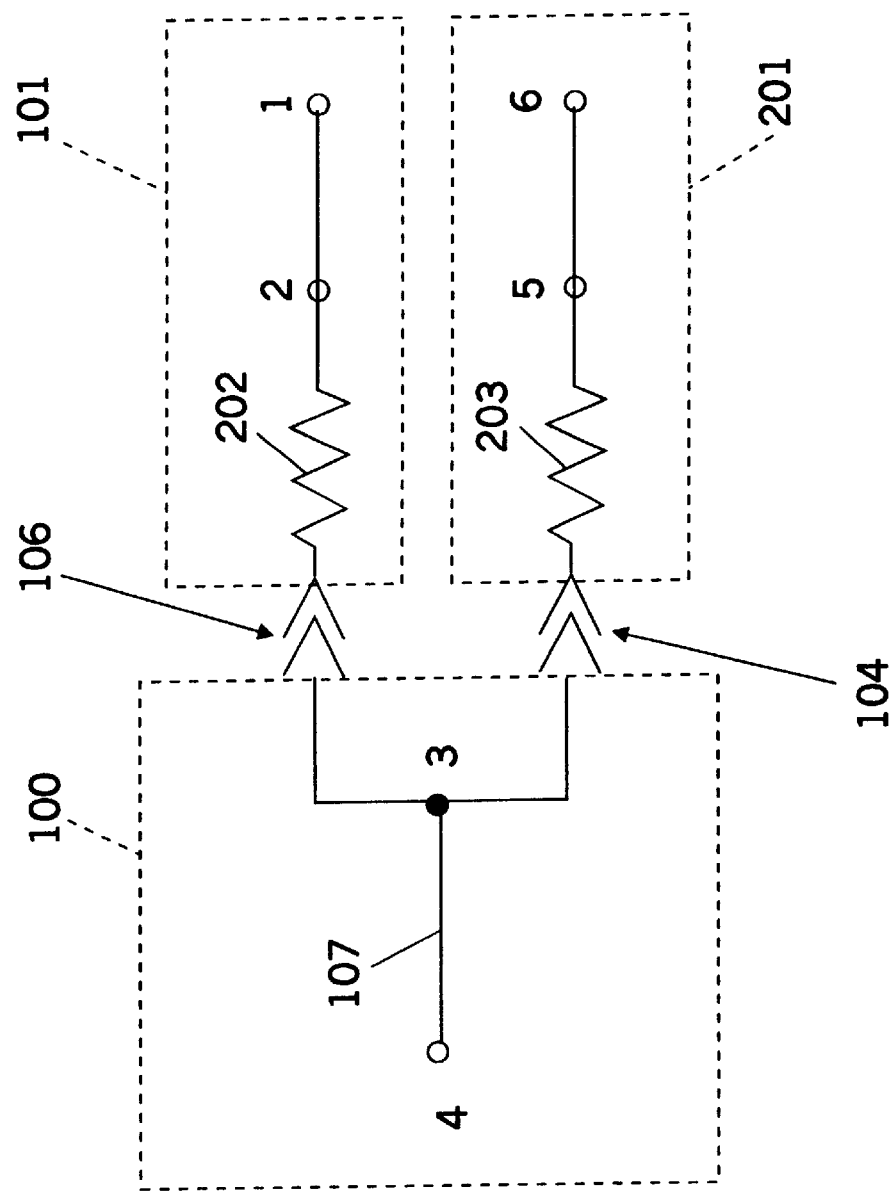
FIG. 2 illustrates a circuit diagram in accordance with the prior art.

FIG. 2 illustrates how the various components within FIG. 1 are connected. Node 1 represents CPU2 103, node 2 represents CPU1 102, and node 3 is as illustrated in FIG. 1, and represents a connection from data net 107 to both of the CPU cards through connectors 104 and 106. Node 4 represents memory controller 105, and nodes 5 and 6 represent the CPU chips mounted on the second CPU card (not shown) mounted within connector 104.

There are three major problems with this topology. These three problems occur when any one of the processors drives the bus. Problem one is when CPU2 103 drives CPU1 102 and receives a negative reflection from node 3 that occurs within the threshold region.

Some background information will now be provided. A transmission line, such as data net 107, will have a character impedance $Z_0$ and is a function of the unit inductance and unit capacitance of the line. A reflection represents the amount of signal reflected by a discontinuity on the transmission line. Whenever a signal encounters an impedance other than $Z_0$, part (or all) of the signal is reflected. If the impedance is greater than $Z_0$, then the reflection will be the same phase as the original signal. If the impedance is less than $Z_0$, the reflection will be phase-reversed. Whenever a transmission line is split into branches or trees, the branching point (which in this example is node 3) becomes a low impedance point since the $Z_0$ of the branches are in parallel. The resultant impedance of the branch node is equal to the equivalent impedance of parallel real resistors of value $Z_0$. Or, if a line splits into N branches, a traveling wave will experience a local impedance of $Z_0/N$ at the branch point. This is always much lower than $Z_0$ and always produces a negative reflection. If this negative reflection is allowed to propagate unchecked, it can create slope reversals and false triggering.

A negative reflection that occurs in the threshold region can cause delays in the switching of the receiver circuits within a particular chip located on the net.

Problem two is when CPU2 103 drives and the memory controller 105 at node 4 receives. Memory controller 105 receives the initial wave and it bounces back to node 3, which bounces back a negative reflection back towards node 4. The third problem is that of delay. When CPU2 103 drives a signal, CPU1 102 must wait for the signal to travel all the way to the CPU at node 6 and back to switch completely. This amounts to almost a 2X net delay.

The first threshold reflection problem can be resolved by adding some losses in the form of resistors 202 and 203 so as to smooth the reflection and in turn clean up the signal in the threshold region. The value can be tuned according to actual hardware and simulation results. This, however, adds delay to the net 107, so it is desirable to minimize the resistor values and still maintain clean threshold regions.

Figure 3:
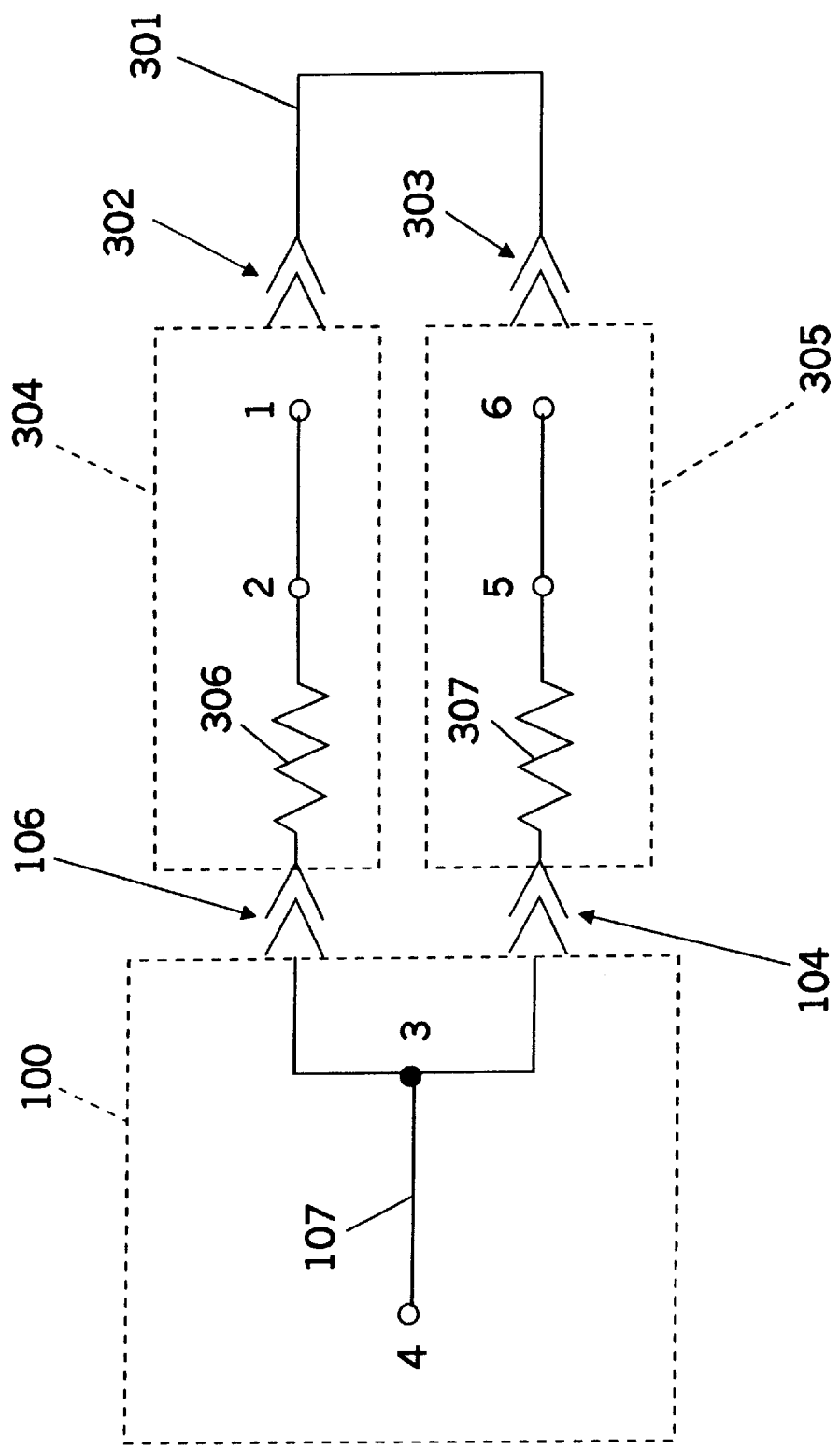
FIG. 3 illustrates a circuit diagram in accordance with an embodiment of the present invention.
Figure 4:
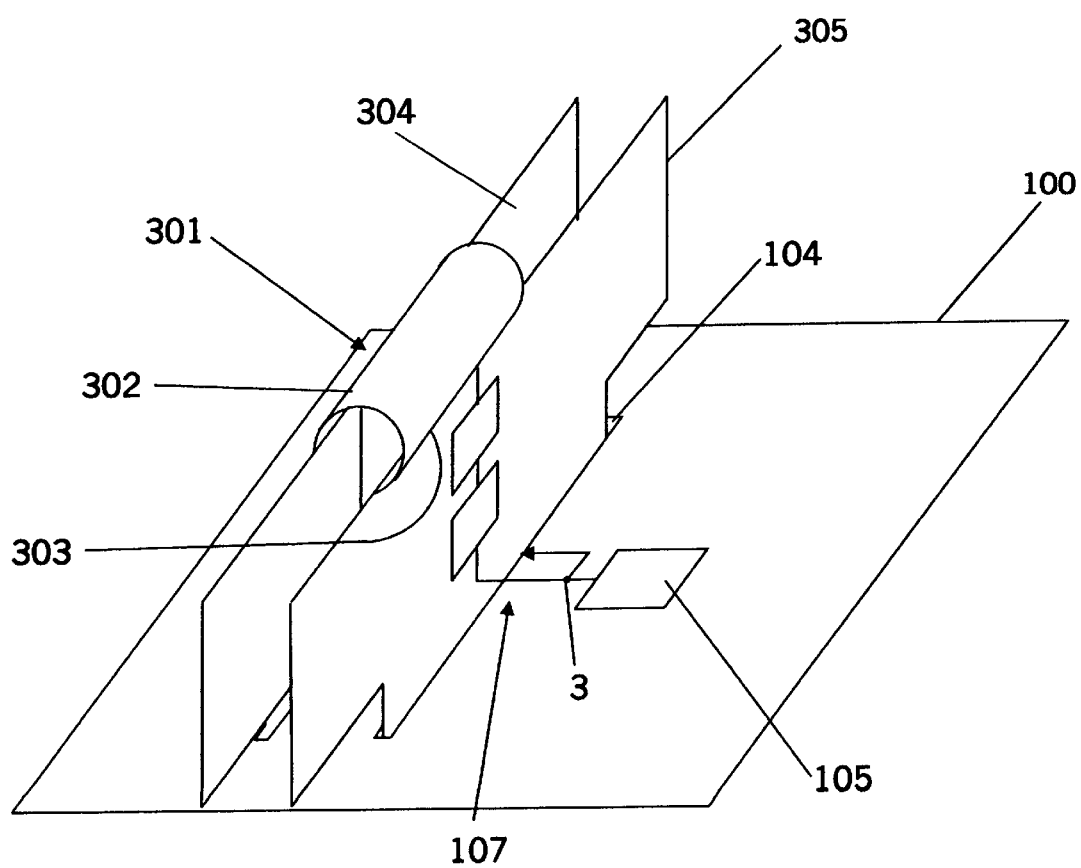
FIG. 4 illustrates the present invention.

Referring to FIGS. 3 and 4, the present invention utilizes a cable connector 301 on top of daughter cards 304 and 305 to interconnect the data lines across the two cards. This forms a loop with a stub between nodes 3 and 4. The stub is the part of the net 107 on the system board 100 that goes to the memory controller 105.

Problems two and three noted above are addressed with this loop implementation. First, the negative reflection seen at the memory controller 105 caused by the low impedance seen at node 3 of the net 107 is cancelled by the waveform traveling from the driving processor over the cable arriving at the same time as the reflection signal, which cancels the reflection effect.

Additionally, the processor closest to the driving processor does not have to wait for the signal to turn back from the other processor card for it to switch. It now switches when the signal travels all the way around the loop which is effectively shorter than the 2X delay provided for by the implementation shown in FIG. 2.

This loop concept can also be applied with some sort of connection directly across the two CPUs, given a left and right CPU card. This would minimize the loop length and improve the electrical performance.

As can be seen, the present invention does not result in any modifications needed to system board 100. Instead, new daughter cards 304 and 305 with their chips (e.g., chips 403 and 404) and resistor values 306 and 307 are sent to the user to replace the original cards (e.g., card 101) to be mounted in the same connectors 104 and 106. Connectors 302 and 303 at the top of the daughter cards 304 and 305, respectively, are connected to the transmission line network. Bus cable 301 is then connected across connectors 302 and 303.

Please note that the present invention is not limited to connections between CPU chips on CPU cards and a memory controller on a system board. Any circuits (i.e., drops) connected within a network can take advantage of the novelty of the present invention.

Figure 5:
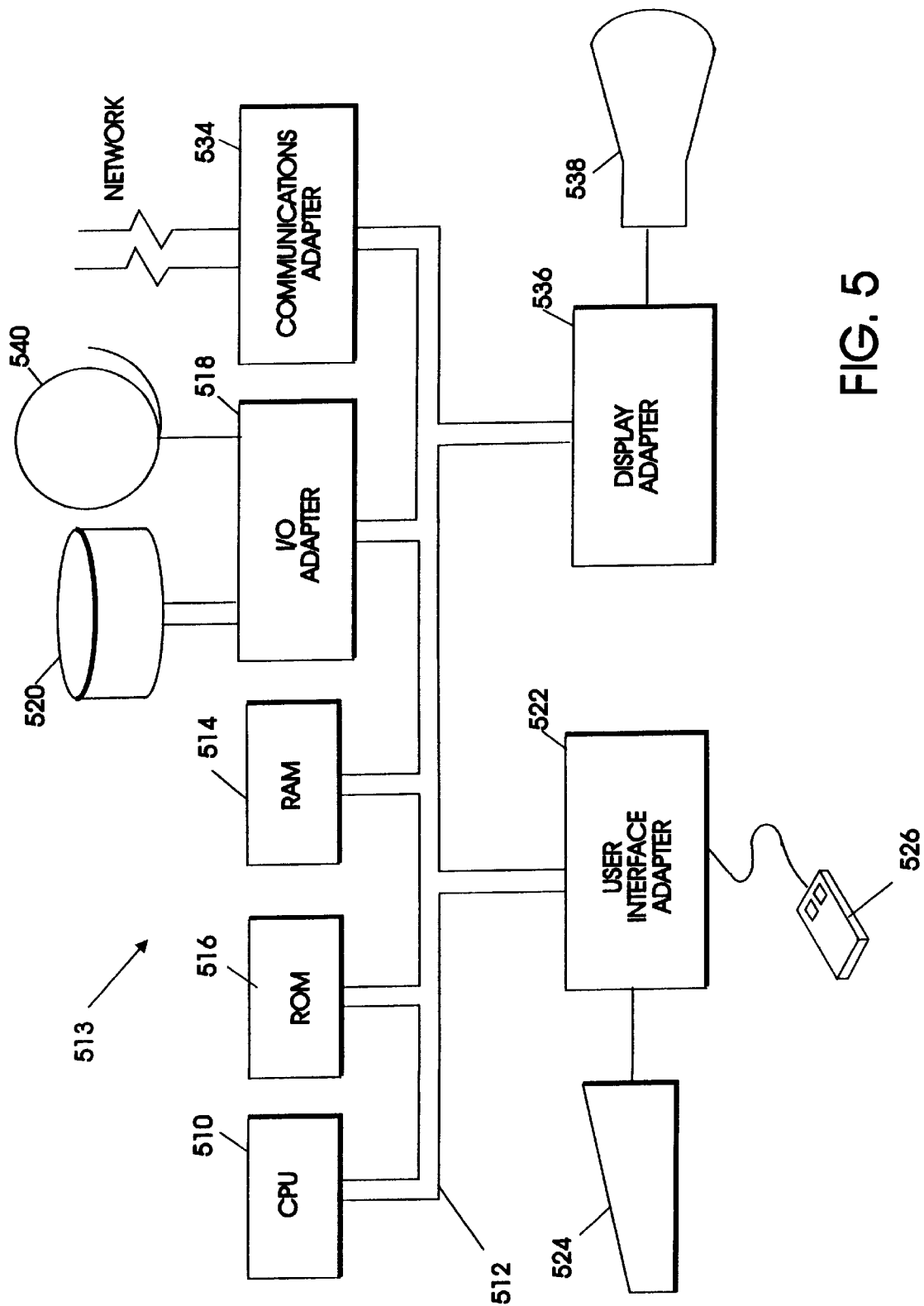
FIG. 5 illustrates a data processing system configured in accordance with the present invention.

Referring next to FIG. 5, there is illustrated a block diagram of a computer system 513 that can take advantage of the implementations of the present invention. Some of the components illustrated in FIG. 5 can be located on the system board, while other components can be located on the attached daughter boards.

A representative hardware environment for practicing the present invention is depicted in FIG. 5, which illustrates a typical hardware configuration of workstation 513 in accordance with the subject invention having central processing unit (CPU) 510, such as a conventional microprocessor, and a number of other units interconnected via system bus 512. Workstation 513 includes random access memory (RAM) 514, read only memory (ROM) 516, and input/output (I/O) adapter 518 for connecting peripheral devices such as disk units 520 and tape drives 540 to bus 512, user interface adapter 522 for connecting keyboard 524, mouse 526, and/or other user interface devices such as a touch screen device (not shown) to bus 512, communication adapter 534 for connecting workstation 513 to a data processing network, and display adapter 536 for connecting bus 512 to display device 538. CPU 510 may include other circuitry not shown herein, which will include circuitry commonly found within a microprocessor, e.g., execution unit, bus interface unit, arithmetic logic unit, etc.

Although the present invention and its advantages have been described in detail, it should be understood that various changes, substitutions and alterations can be made herein without departing from the spirit and scope of the invention as defined by the appended claims.

What is claimed is:

1. An apparatus comprising:
   a first printed circuit board ("PCB") having a first drop mounted thereon connected by a first transmission line net to first and second connectors;

a second PCB connected to the first connector, the second PCB having a second drop mounted thereon and connected by a second transmission line net to the first connector;

a third PCB connected to the second connector, the third PCB having a third drop mounted thereon and connected by a third transmission line net to the second connector; and a fourth transmission line net connecting the second net to the third net, wherein the fourth transmission line net creates a transmission line loop when connecting the second transmission line net to the third transmission line net the transmission line loop improving signal quality of signals transmitted between the first second and third drops.

2. The apparatus as recited in claim 1, wherein the first second, third and fourth transmission line nets have a characteristic impedance Zo and the transmission line loop has a characteristic impedance of Zo/2 to signals applied to the transmission loop.

3. The apparatus as recited in claim 1, wherein the fourth transmission line net is connected by a third connector to the second transmission line net, and wherein the fourth transmission line net is connected by a fourth connector to the third transmission line net.

4. The apparatus as recited in claim 1, wherein the fourth transmission line net is not located on the first PCB.

5. The apparatus as recited in claim 1, wherein the first PCB is a computer motherboard, and wherein the second and third PCBs are daughterboards.

6. The apparatus as recited in claim 1, further comprising:

a fourth drop connected to the second transmission line net; and a fifth drop connected to the third transmission line net.

7. The apparatus as recited in claim 1, wherein the second and the third transmission line nets are coupled to the first connector and the second connector respectively with series resistors.

8. The apparatus as recited in claim 5, wherein the drops are integrated circuits.

9. The apparatus as recited in claim 6, wherein signals on the first, second, third and fourth transmission line nets are transmitted bidirectional.

10. The apparatus as recited in claim 8, wherein the first drop is a memory controller, and wherein the second and third drops are CPUs.

11. An apparatus comprising:

a motherboard having a first integrated circuit ("IC") mounted thereon and connected by a stub to a first transmission line net, wherein the first transmission line net connects first and second connectors mounted on the motherboard;

a first circuit card connected to the first connector, the first circuit card having second and third IC's mounted thereon and connected to a second transmission line net that is connected to the first connector;

a second circuit card connected to the second connector, the second circuit card having fourth and fifth IC's mounted thereon and connected to a third transmission line net that is connected to the second connector;

circuitry for connecting the second and third transmission line nets, wherein the circuitry creates a transmission line loop when connecting the second transmission line net to the third transmission line net, the transmission line loop improving signal quality of signals transmitted between the first, second and third drops.

12. The apparatus as recited in claim 11, wherein the connecting circuitry is not located on the motherboard.

13. The apparatus as recited in claim 11, wherein the motherboard includes a first CPU mounted thereon, and wherein the second, third, fourth, and fifth IC's are CPUs.

14. The apparatus as recited in claim 11, wherein the first, second, third and fourth transmission line nets have a characteristic impedance Zo and the transmission line loop has a characteristic impedance of Zo/2 to signals applied to the transmission loop.

15. The apparatus as recited in claim 12, wherein the connecting circuitry further comprises:

a third connector mounted on the first circuit card and connected to the second transmission line net;

a fourth connector mounted on the second circuit card and connected to the third transmission line net; and a fourth transmission line net connecting the third and fourth connectors.

16. The apparatus as recited in claim 15, wherein the third connector is mounted on an opposite side of the first circuit card from a side that mounts into the first connector, and wherein the fourth connector is mounted on an opposite side of the second circuit card from a side that mounts into the second connector.

17. The apparatus as recited in claim 16, wherein the transmission line nets comprises busses.

18. A method for upgrading a computer system, comprising the steps of:

mounting a first circuit card into a first connector in a system board;

mounting a second circuit card into a second connector in the system board, wherein the system board includes a first IC mounted thereon and connected by a first transmission line net to a second transmission line net connecting the first and second connectors, wherein the first circuit card includes a second IC mounted thereon and connected to a third transmission line net adaptable for connecting to the first connector when the first circuit card is mounted into the first connector, wherein the second circuit card includes a third IC mounted thereon and connected to a fourth transmission line net adaptable for connecting to the second connector when the second circuit card is mounted into the second connector; and connecting the third and fourth transmission line nets without modifying any circuitry on the system board.

19. The method as recited in claim 18, wherein the connecting step further comprises the step of connecting a fifth transmission line net between a third connector mounted on the first circuit card and a fourth connector mounted on the second circuit card, wherein the third connector is connected to the third transmission line net, and wherein the fourth connector is connected to the fourth transmission line net, wherein connecting the fifth transmission line net to the third and fourth connectors further creates a transmission line loop, the transmission line loop improving signal quality of signals transmitted between the first, second and third ICs.

* * * * *

UNITED STATES PATENT AND TRADEMARK OFFICE
CERTIFICATE OF CORRECTION

| | | |
|---|---|---|
| PATENT NO. | : 6,219,733 B1 | |
| DATED | : April 17, 2001 | |
| INVENTOR(S) | : William Dale Appel; Franklin Mark Liu | |

It is certified that error appears in the above-identified patent and that said Letters Patent is hereby corrected as shown below:

Column 5,
Line 13, after the second occurrence "net", insert -- , --

Signed and Sealed this

Eighteenth Day of December, 2001

*Attest:*

*Attesting Officer*

JAMES E. ROGAN
*Director of the United States Patent and Trademark Office*